(12) United States Patent
Kim et al.

(10) Patent No.: US 7,745,861 B2
(45) Date of Patent: Jun. 29, 2010

(54) PHOTODIODES AND IMAGE SENSORS INCLUDING THE SAME

(75) Inventors: Gi-bum Kim, Yongin-si (KR); Taek Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 73 days.

(21) Appl. No.: 11/907,569

(22) Filed: Oct. 15, 2007

(65) Prior Publication Data
US 2008/0128769 A1 Jun. 5, 2008

(30) Foreign Application Priority Data
Dec. 1, 2006 (KR) ...................... 10-2006-0120975

(51) Int. Cl.
*H01L 27/108* (2006.01)
(52) U.S. Cl. .................. 257/292; 257/454; 257/461
(58) Field of Classification Search ............ 257/292, 257/454, 461
See application file for complete search history.

(56) References Cited

U.S. PATENT DOCUMENTS 5,009,717 A * 4/1991 Komabayashi et al. ...... 136/201

* cited by examiner

*Primary Examiner*—Long Pham
(74) *Attorney, Agent, or Firm*—Harness, Dickey & Pierce, PLC

(57) ABSTRACT

Example embodiments may provide a photodiode formed of semiconductor silicide and/or an image sensor using a photodiode formed of semiconductor silicide. The photodiode may have a p-n junction structure including a p-type semiconductor silicide and an n-type semiconductor silicide. The image sensor may include a substrate, a photodetector unit having the photodiode, which may perform photoelectric transformation, and/or a signal transmitter transmitting a signal generated by the photodetector unit to an output unit. The photodetector unit and/or the signal transmitter may be integrated in the substrate.

9 Claims, 2 Drawing Sheets

US 7,745,861 B2

PHOTODIODES AND IMAGE SENSORS INCLUDING THE SAME

PRIORITY STATEMENT

This application claims priority under 35 U.S.C. §119 to Korean Patent Application No. 10-2006-0120975, filed on Dec. 1, 2006 in the Korean Intellectual Property Office (KIPO), the entire contents of which are incorporated herein by reference.

BACKGROUND

1. Field

Example embodiments may relate to photodiodes and/or image sensors including photodiodes, for example, to photodiodes formed of semiconductor silicide and/or image sensors including a photodiode formed of semiconductor silicide.

2. Description of the Related Art

An image sensor may be a photoelectric device that may detect light and/or convert the light into an electric signal. Related art image sensors may include a plurality of pixels arranged in a matrix on a semiconductor substrate. Each of the pixels may include a photodiode and/or a transistor. A semiconductor layer and the photodiode, which may be on a semiconductor substrate, may detect external light to generate photocharge. Photocharge may accumulate in the photodiode. The transistor may output an electrical signal based on the charge magnitude of the generated photocharge.

Related art image sensors may be miniaturized to create mega pixel image sensors having a pixel size of about 1.1 microns or less. Because related art mega pixel image sensors may have a smaller pixel size, light intensity may be reduced. In the case of a related art complimentary metal oxide semiconductor (CMOS) image sensor including a coplanar photodetector unit and CMOS device for transmitting signals generated by the photodetector unit, because a fill factor may not be sufficient, deterioration of light sensitivity may increase due to reduction of pixel size. An amorphous Si-based photodiode may not be useable in related art image sensors due to a limitation of the visible light absorption coefficient of Si.

SUMMARY

Example embodiments may provide image sensors including a photo-detecting material having an improved visible absorption coefficient in order to prevent or reduce deterioration of light sensitivity in example embodiment image sensors.

Example embodiments may provide a photodiode having a p-n junction structure including a p-type semiconductor silicide and an n-type semiconductor silicide.

Example embodiments may provide an image sensor including a substrate, a photodetector unit that may perform photoelectric transformation, and/or a signal transmitter that may transmit a signal generated by the photodetector unit to an output unit. The photodetector unit and/or the signal transmitter may be in the substrate, and the photodetector unit may include a photodiode having a p-n junction structure including a p-type semiconductor silicide and an n-type semiconductor silicide.

The p-type semiconductor silicide and/or the n-type semiconductor silicide may include $FeSi_2$, $Ru_2Si_3$, $Os_2Si_3$, $Ir_3Si_5$, and/or another suitable silicide material.

The photodiode may have a PIN structure in which an intrinsic layer may be between the p-type semiconductor silicide and the n-type semiconductor silicide.

The intrinsic layer may include insulating amorphous silicon (a-Si).

The signal transmitter may include a complimentary metal oxide semiconductor (CMOS).

Example embodiment image sensors may further include a wire layer between the photodetector unit and the signal transmitter, wherein the photodetector unit may be above the signal transmitter.

The signal transmitter may include a charge coupled device (CCD).

BRIEF DESCRIPTION OF THE DRAWINGS

The above and other features and/or advantages of example embodiments will become more apparent by describing them in detail with reference to the attached drawings in which.

DETAILED DESCRIPTION

Figure 1:
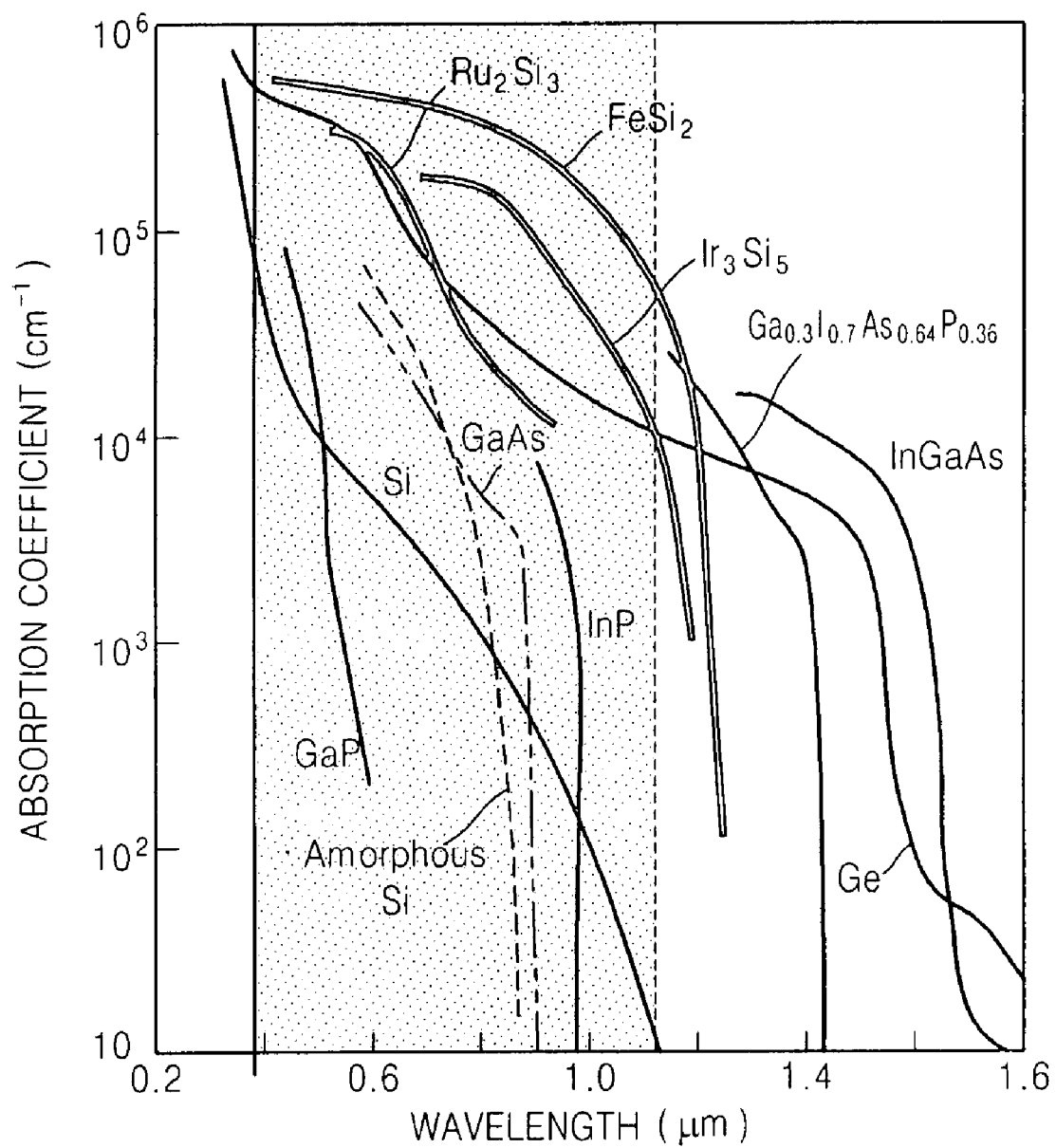
FIG. 1 is a graph illustrating light absorption of semiconductor silicide versus wavelength.

Example embodiments will now be described more fully with reference to the attached drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. In the drawings, the thicknesses of layers and regions are exaggerated for clarity. Like numbers refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a graph illustrating light absorption of semiconductor silicide versus wavelength. Table 1 shows the crystal structure, energy band gap Eg, and transition type of semiconductor silicide.

TABLE 1

(all values are approximate)

| Material | Crystal structure | Eg (eV) | |
|---|---|---|---|
| $Mg_2Si$ | Cubic system | 0.78 | indirect transition type |
| $BaSi_2$ | orthorhombic system | 1.3 | |
| $CrSi_2$ | hexagonal system | 0.35 | indirect transition type |
| $MoSi_2$ | hexagonal system | 0.07 | indirect transition type |

TABLE 1-continued (all values are approximate)

| Material | Crystal structure | Eg (eV) | |
|---|---|---|---|
| $WSi_2$ | hexagonal system | 0.07 | indirect transition type |
| $MnSi_{1.72}$ | tetragonal system | 0.7 | |
| $ReSi_{1.75}$ | triclinic system | 0.12 | indirect transition type |
| $FeSi_2$ | orthorhombic system | 0.8 | direct transition type |
| $Ru_2Si_3$ | orthorhombic system | 0.8 | direct transition type |
| $Os_2Si_3$ | orthorhombic system | 2.3 | direct transition type |
| $OsSi$ | Cubic system | 0.34 | |
| $OsSi_2$ | orthorhombic system | 1.8 | indirect transition type |
| $Ir_3Si_5$ | monoclinic system | 1.2 | direct transition type |

Semiconductor silicide, which may be used in an example embodiment photodiode, will be described in detail with reference to FIG. 1 and Table 1.

Because a potential barrier in the form of an energy band gap Eg may be formed at a p-n junction portion, if light of a greater energy than the energy band gap Eg is incident upon the p-n junction, electrons may be excited across the band gap Eg to a conduction band and generate photocharge. As shown in Table. 1, because direct transition semiconductor silicides such as $FeSi_2$, $Ru_2Si_3$, $Os_2Si_3$, $Ir_3Si_5$, and the like may have an energy band gap common to visible light energy, direct transition semiconductor silicides in a photo-detecting material may have better optical properties compared with an indirect transition type Si. As shown in FIG. 1, in the range of about 0.38 to about 0.8 microns, which includes the visible light wavelength, direct transition type semiconductor silicides may have increased light absorption coefficients than Si used in related art photodetector units of complimentary metal oxide semiconductor (CMOS) image sensors by a factor of about 20 to about 100 times. $FeSi_2$ and/or $Ir_3Si_5$ may have a higher light absorption coefficient for near infrared wavelengths as well. Example embodiments may use a direct transition type semiconductor silicide.

Figure 2:
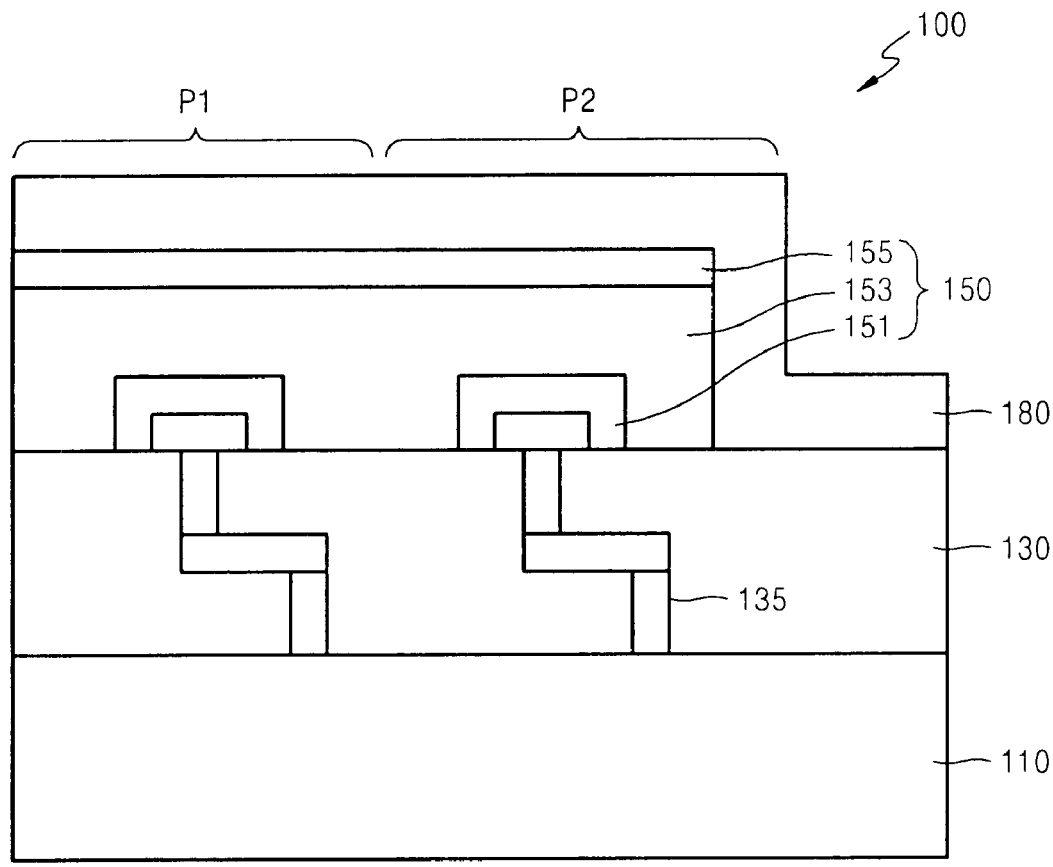
FIG. 2 is a cross-sectional view illustrating an example embodiment image sensor.

FIG. 2 is a cross-sectional view illustrating an example embodiment image sensor 100.

As shown in FIG. 2, the image sensor 100 may include a substrate 110, a wire layer 130 on the substrate 110, a photodiode 150, which may be a photodetector unit on the wire layer 130, and/or a transparent electrode 180 covering the photodiode 150. The substrate 110 may be, for example, a silicon-on-insulator (SOI) substrate, a general silicon substrate, an oxide layer, and/or an insulating layer. The wire layer 130 may electrically connect the photodiode 150 to the substrate 110, and may have a wiring structure including at least one insulating layer and/or a via hole 135. A CMOS signal transmitter (not shown) for transmitting signals generated from the photodiode 150 to an output unit may be in the substrate 110.

The photodiode 150 may have a PIN structure including an n-layer 151, a p-layer 155, and/or an intrinsic layer 153 between the n-layer 151 and the p-layer 155. The intrinsic layer 153 may be on the n-layer 151, and the p layer 155 may be on the intrinsic layer 153. Several variations may be possible—the intrinsic layer 153 may be on the p-layer 155, and the n-layer 151 may be on the intrinsic layer 153. The n-layer 151 and the p-layer 155 may be formed by adding n-type impurities and p-type impurities to a semiconductor silicide. The semiconductor silicide may be, for example, $FeSi_2$, $Ru_2Si_3$, $Os_2Si_3$, $Ir_3Si_5$, and/or any other material as described in Table 1 and FIG. 1. The intrinsic layer 153 may be an intrinsic layer without impurities and may be formed of insulating amorphous silicon (a-Si) or another suitable material. The PIN structure may be a PIN structure in which typical p-type and/or n-type semiconductors in a pin photodiode are substituted by semiconductor silicide. The image sensor 100 may have improved light sensitivity and/or a wider dynamic range by using a semiconductor silicide having a higher light absorption coefficient of. Example embodiments may achieve the same degree of photo sensitivity as related art Si photodetector units formed, but with a thickness less than that of a related art Si photodetector.

The photodiode 150 having the above-described PIN structure may have better charge mobility due to a higher electric field in the intrinsic layer 153, compared with a related art photodiode having a simple p-n junction structure. The photodiode 150 is not limited to having the PIN structure described above; that is, the photodiode 150 may have a simple p-n junction structure including a p-type semiconductor silicide and an n-type semiconductor silicide.

The n-layer 151 may be on the wire layer 130 and/or may be electrically connected to the via hole 135. The image sensor 100 may be formed by two-dimensionally arranging a plurality of unit pixels P1 and P2. Because each of the unit pixels P1 and P2 may include at least one photodiode 150, at least one via hole 135 may be formed in each of the unit pixels P1 and P2. The via hole 135 may be a hole in the wire layer 130. The via hole 135 may be filled with a metal having suitable conductivity and may function as an electrical path between layers. The wire layer 130 may include a plurality of insulating layers. The via hole 135 may pass through each of the layers and/or a plated region patterned between each of layers. The transparent electrode 180 may include a transparent conductive material such as indium tin oxide (ITO or InSnO). The transparent electrode 180 may be connected to the p-layer 155 of the photodiodes 150. A protection layer (not shown) for physical protection or electrical insulation may be on the transparent electrode 180.

An electron-hole pair generated in the n-layer 151 and/or p-layer 155 by external light may diffuse to the intrinsic layer 153, which may be a depletion layer. The electron-hole pair may be accelerated by an electric field, and then the electron may move to the n-layer 151 and the hole may move to the p-layer 155. Electrical charge accumulated in the n-layer 151 and the p-layer 155 may be transmitted through the wire layer 130 to the CMOS signal transmitter in the substrate 110.

The CMOS signal transmitter may transmit electrical signals generated from the photodiode 150. The CMOS signal transmitter may be in the substrate 110. Example embodiments may include a CMOS image sensor having a wire layer on a substrate including the CMOS signal transmitter thereon and/or a photodiode on the wire layer. A signal transmitter may be implemented in example embodiments based on the type of an image sensor. Various types of signal transmitters may be used in the image sensor 100. For example, the signal transmitter used in the image sensor 100 may be a charge coupled device (CCD), which may convert electrons generated by light into an electrical signal in each pixel to output the electrical signal through various CMOS switches.

Figure 3:
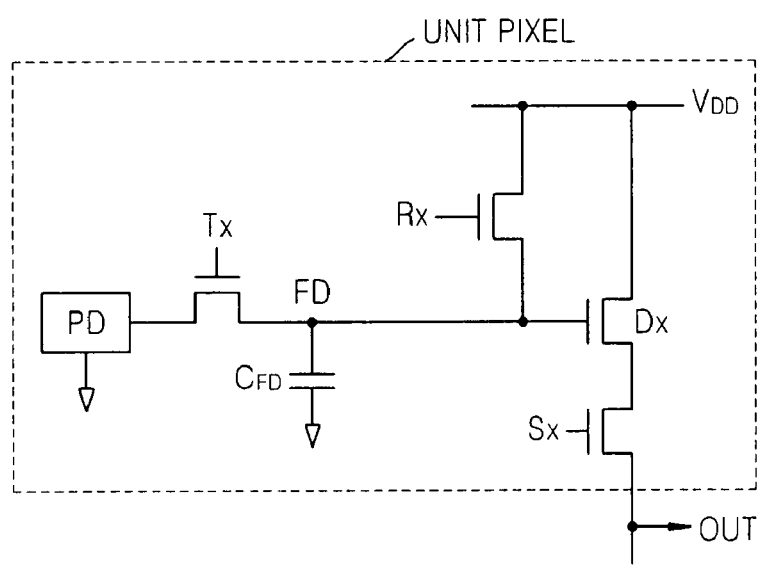
FIG. 3 is a circuit diagram of a unit pixel of the example embodiment image sensor of FIG. 2.

Example embodiment CMOS signal transmitters may include at least one transistor in every unit pixel. FIG. 3 is a circuit diagram of one of the unit pixels P1 and P2 of the example embodiment image sensor 100 of FIG. 2. As shown in FIG. 3, the unit pixel may include a photodiode PD 150 and up to four NMOS transistors including a transfer transistor $T_X$, a reset transistor $R_X$, a drive transistor $D_X$, and/or a select transistor $S_X$. A circuit including four NMOS transistors may correspond to a CMOS signal transmitter. The CMOS signal transmitter may be formed on the substrate 110 using a CMOS process.

The transfer transistor $T_X$ may transmit photocharge from a photodiode PD to a floating diffusion area FD. The reset transistor $R_X$ may reset the floating diffusion area FD so that a supply voltage $V_{DD}$ may be applied to a floating diffusion area FD, and thus the floating diffusion area FD may emit electric charge stored therein. The drive transistor $D_X$ and the select transistor $S_X$ may function as a source follower. The select transistor $S_X$ may be a transistor for switching and addressing and may receive a pixel data enabling signal to transmit a pixel data signal to an output. A drain region of the select transistor $S_X$ may be connected to an output terminal OUT outputting an output voltage. In FIG. 3, "$C_{FD}$" may be the capacitance of the floating diffusion area FD. A peripheral circuit unit including a CMOS switch/transistor may be connected to the drain region of the select transistor $S_X$.

As shown in FIG. 2, the image sensor 100 may have a wire layer 130 on the substrate 110 including a CMOS signal transmitter therein and the photodiode 150 on the resulting structure. This structure may be different from related art CMOS image sensors in that the photodiode 150 may not be on the same plane as the CMOS signal transmitter, the photodiode 150 may be separated from the CMOS signal transmitter by the wire layer 130, the CMOS signal transmitter may be below the wire layer 130, and the photodiode 150 may be above the wire layer 130. Because the photodiode 150 may be above the CMOS signal transmitter, a fill factor, that is, a ratio of the area of a photoelectric transformation element to a pixel area, may be increased. As the fill factor increases, higher light intensity may be obtained for the same unit pixel area. Light sensitivity of the image sensor 100 may be improved, and the dynamic range of light may be increased.

The semiconductor silicide as a photo-detecting material of the photodiode 150 may have a higher light absorption coefficient. Structurally, because sufficient intensity of light incident to the photodiode 150 may be obtained, the photodiode 150 may be suitable for a mega pixel CMOS image sensor.

Silicide may be used as a lower resistance contact in a Si CMOS process, and may be suitable for a Si process. The formation and integration technologies of silicide are well known in the art. Thus, if semiconductor silicide is used in example embodiment image sensors, manufacturing may be more efficient.

Example embodiment photodiodes and image sensors may have improved light sensitivity and/or a wider dynamic range because the photodiode may have a smaller thickness than that of a conventional Si photodetector unit due to the higher light absorption coefficient of the semiconductor silicide in the photodiode. If a semiconductor Si photodetector unit is on the surface of the photodiode, because the fill factor is increased, light sensitivity may be improved.

Example embodiments having been particularly shown and described with reference to the attached figures, it will be understood by those of ordinary skill in the art that various changes in form and details may be made therein without departing from the spirit and scope of the disclosure as defined by the following claims.

What is claimed is:

1. A photodiode comprising:
   a p-type semiconductor silicide;
   an n-type semiconductor silicide that forms a p-n junction structure with the p-type semiconductor silicide; and
   an intrinsic layer between the p-type semiconductor silicide and the n-type semiconductor silicide so as to form a PIN structure,
   wherein the intrinsic layer includes insulating amorphous silicon (a-Si).

2. The photodiode of claim 1, wherein the p-type semiconductor silicide and the n-type semiconductor silicide include at least one of $FeSi_2$, $Ru_2Si_3$, $Os_2Si_3$, and $Ir_3Si_5$.

3. An image sensor comprising:
   a substrate;
   a photodiode including a p-type semiconductor silicide and an n-type semiconductor silicide that forms a p-n junction structure with the p-type semiconductor silicide; and
   a signal transmitter in the substrate, the signal transmitter being configured to transmit a signal generated by the photodiode to an output unit.

4. The image sensor of claim 3, wherein the p-type semiconductor silicide and the n-type semiconductor silicide include at least one of $FeSi_2$, $Ru_2Si_3$, $Os_2Si_3$, and $Ir_3Si_5$.

5. The image sensor of claim 3, wherein the photodiode further includes an intrinsic layer between the p-type semiconductor silicide and the n-type semiconductor silicide so as to form a PIN structure.

6. The image sensor of claim 3, wherein the intrinsic layer includes insulating amorphous silicon (a-Si).

7. The image sensor of claim 3, wherein the signal transmitter includes a complimentary metal oxide semiconductor (CMOS).

8. The image sensor of claim 3, further comprising:
   a wire layer between the photodiode and the signal transmitter, wherein the photodiode is above the signal transmitter.

9. The image sensor of claim 3, wherein the signal transmitter includes a charge coupled device (CCD).

* * * * *